US006906933B2

(12) United States Patent
Taimela

(10) Patent No.: US 6,906,933 B2
(45) Date of Patent: Jun. 14, 2005

(54) POWER SUPPLY APPARATUS AND METHODS WITH POWER-FACTOR CORRECTING BYPASS MODE

(75) Inventor: Pasi S. Taimela, Raleigh, NC (US)

(73) Assignee: Powerware Corporation, Raleigh, NC (US)

( * ) Notice: Subject to any disclaimer, the term of this patent is extended or adjusted under 35 U.S.C. 154(b) by 33 days.

(21) Appl. No.: 10/286,027

(22) Filed: Nov. 1, 2002

(65) Prior Publication Data

US 2004/0085785 A1 May 6, 2004

(51) Int. Cl.[7] .......................... H02M 5/458; H02M 5/40
(52) U.S. Cl. .......................................... 363/37; 363/34
(58) Field of Search ........................... 363/37, 34, 124, 363/131, 127, 132, 98; 323/205, 207; 307/105, 43–46

(56) References Cited

U.S. PATENT DOCUMENTS

| | | |
|---|---|---|
| 4,456,872 A | 6/1984 | Froeschle |
| 5,126,585 A | 6/1992 | Boys |
| 5,289,045 A | 2/1994 | Lavin et al. |
| 5,345,165 A | 9/1994 | Froeschle |
| 5,384,792 A | 1/1995 | Hirachi |
| 5,612,580 A | 3/1997 | Janonis et al. |
| 5,633,789 A | 5/1997 | Kimura et al. |
| 5,638,244 A | 6/1997 | Mekanik et al. |
| 5,737,209 A | 4/1998 | Stevens |
| 5,747,887 A | 5/1998 | Takanaga et al. |
| 5,764,496 A | 6/1998 | Sato et al. |
| 5,771,161 A | 6/1998 | Jackson et al. |
| 5,777,866 A | 7/1998 | Jacobs et al. |
| 5,867,377 A | 2/1999 | Suranyi |
| 5,949,662 A | 9/1999 | Boldin et al. |
| 5,978,236 A | 11/1999 | Faberman et al. |
| 6,052,292 A | 4/2000 | Podlesak |
| 6,295,215 B1 * | 9/2001 | Faria et al. ................... 363/37 |
| 6,295,216 B1 | 9/2001 | Faria et al. |
| 6,411,067 B1 | 6/2002 | Bjorklund |
| 2002/0153779 A1 | 10/2002 | Wade et al. |

OTHER PUBLICATIONS

Hirachi et al., "A High–Frequency–Linked Single Phase UPS with Power Factor Correction Scheme," IEEE Catalog No. 97[TH]8280, ISIE '97, Guimaraes, Portugal, pp. 619–624.

Wu et al., "A New UPS Scheme Provides Harmonic Suppression and Input Power Factor Correction," IEEE Transactions on Industrial Electronics, 42 (1995) Dec., No. 6, New York, pp. 629–635.

International Search Report, PCT/US03/33858, Apr. 6, 2004.

* cited by examiner

Primary Examiner—Rajnikant B. Patel
(74) Attorney, Agent, or Firm—Myers Bigel Sibley & Sajovec

(57) ABSTRACT

A power supply apparatus, such as an uninterruptible power supply, includes an AC input configured to be coupled to an AC power source and an AC output. The apparatus also includes an AC/DC converter circuit, e.g., a boost rectifier circuit, with an input coupled to the AC input. The apparatus further includes a DC/AC converter circuit, e.g., an inverter circuit, configured to be coupled between an output of the AC/DC converter circuit and the AC output. A bypass circuit is operative to establish a coupling between the AC input to the AC output in a first (e.g., bypassed) state and to interrupt the coupling in a second (e.g., "on line") state. The AC/DC converter circuit is operative to control current at the AC input when the bypass circuit is in the first state. For example, the AC/DC converter circuit may be operative to control current at the AC input to correct a power factor at the AC input port when bypassed, such that the AC/DC converter circuit may act as a line conditioner in the bypassed state.

26 Claims, 5 Drawing Sheets

POWER SUPPLY APPARATUS AND METHODS WITH POWER-FACTOR CORRECTING BYPASS MODE

BACKGROUND OF THE INVENTION

The invention relates to power conversion apparatus and methods, and more particularly, to power conversion apparatus and methods for use, for example, in redundant power supply systems such as uninterrupted or uninterruptible power supplies (UPSs).

Power supply circuits are commonly used in equipment such as UPSs, motor drives, and other applications. Conventional UPSs use a variety of different circuit topologies, including standby, line-interactive and on-line topologies. Generally, each of these topologies has advantages and disadvantages and, accordingly, selection of a particular topology is typically governed by the needs of the application.

Many UPSs use an online topology. For example, a typical online UPS includes an AC/AC converter that produces an AC output voltage at a load from an AC input voltage provided by an AC power source such as a utility, using a DC link that can isolate the load from disturbance and other degradation of the AC power source. The intermediate DC bus is typically coupled to an inverter that inverts the DC voltage on the DC bus to produce an AC output. Other circuits, such as filters and regulators, may be included in the path with the rectifier and the inverter. Typically, the DC bus is also coupled to an auxiliary source of power, such as a battery, fuel cell and/or generator, which maintains the DC voltage on the DC bus in the event the AC power source fails. Some online UPSs use other circuit topologies, such as delta converters.

Under normal operating conditions, an online UPS supplies power to a load through a rectifier/inverter chain or other regulating circuitry, providing relatively clean and regulated power at the output of the UPS. When the AC power source fails, the UPS may achieve an uninterrupted transition to auxiliary power, as there typically is no need to change the state of a transfer switch. Some online UPSs also include a bypass feature such that, in the event of a failure and/or selection of this mode, the inverter is prevented from supplying power to the load (e.g., by disconnecting it from the load or placing it into an inactive standby state) while the load is directly coupled to the AC power source via a bypass path. Such a feature may be used to provide an "economy" mode of operation, as power dissipation associated with the operation of the rectifier/inverter chain may be reduced when the load is transferred to the bypass path.

However, such an approach may be compromised if the AC power source is subject to small but frequent excursions outside of the power quality criteria, as may be the case, for example, in systems powered by an unsteady AC power source, such as an auxiliary generator set. In such a case, the UPS may be forced to power the load through the inverter in order to meet the power quality requirements of the load, thus reducing the opportunity for greater efficiency through bypass operation. Techniques for controlling power factor and other power quality parameters in a higher efficiency mode of a UPS are described in U.S. Pat. No. 6,295,215 to Faria et al.

SUMMARY OF THE INVENTION

According to some embodiments of the invention, a power supply apparatus, such as an uninterruptible power supply, includes an AC input configured to be connected to an AC power source and an AC output. The apparatus also includes an AC/DC converter circuit, e.g., a boost rectifier circuit, with an input coupled to the AC input. The apparatus further includes a DC/AC converter circuit, e.g., an inverter circuit, configured to be coupled between an output of the AC/DC converter circuit and the AC output. A bypass circuit is operative to establish a coupling between the AC input and the AC output in a first (e.g., bypassed) state and to interrupt the coupling in a second (e.g., "on line") state. The AC/DC converter circuit is operative to control current at the AC input when the bypass circuit is in the first state, such that, for example, a power factor at the AC input port may be corrected. In this manner, the AC/DC converter circuit may act as a line conditioner in the bypassed state.

In further embodiments of the invention, the AC/DC converter circuit comprises a current reference signal generating circuit operative to generate a current reference signal responsive to a voltage at the AC input. A current control circuit is operative to control a switch circuit, e.g., a transistor half-bridge, of the AC/DC converter circuit responsive to the current reference signal and to a current at the AC input, thereby controlling current at the AC input port. Such control may be implemented using digital and/or analog control circuitry. The current at the AC input may be sensed by a single current sensor coupled between the AC input and a junction of the AC/DC converter circuit and the bypass circuit and/or by multiple sensors placed in current paths coupled to the AC input.

Potential advantages of the invention are numerous. According to some embodiments, a current control loop used to control an AC/DC converter may be less susceptible to high frequency perturbations in the input voltage and has a bandwidth that is limited mainly by the maximum switching frequency of the transistors or other switching devices used in the AC/DC converter circuit. Such a control loop may be operated seamlessly over multiple modes, e.g., on-line and bypassed modes.

DETAILED DESCRIPTION

Figure 1:
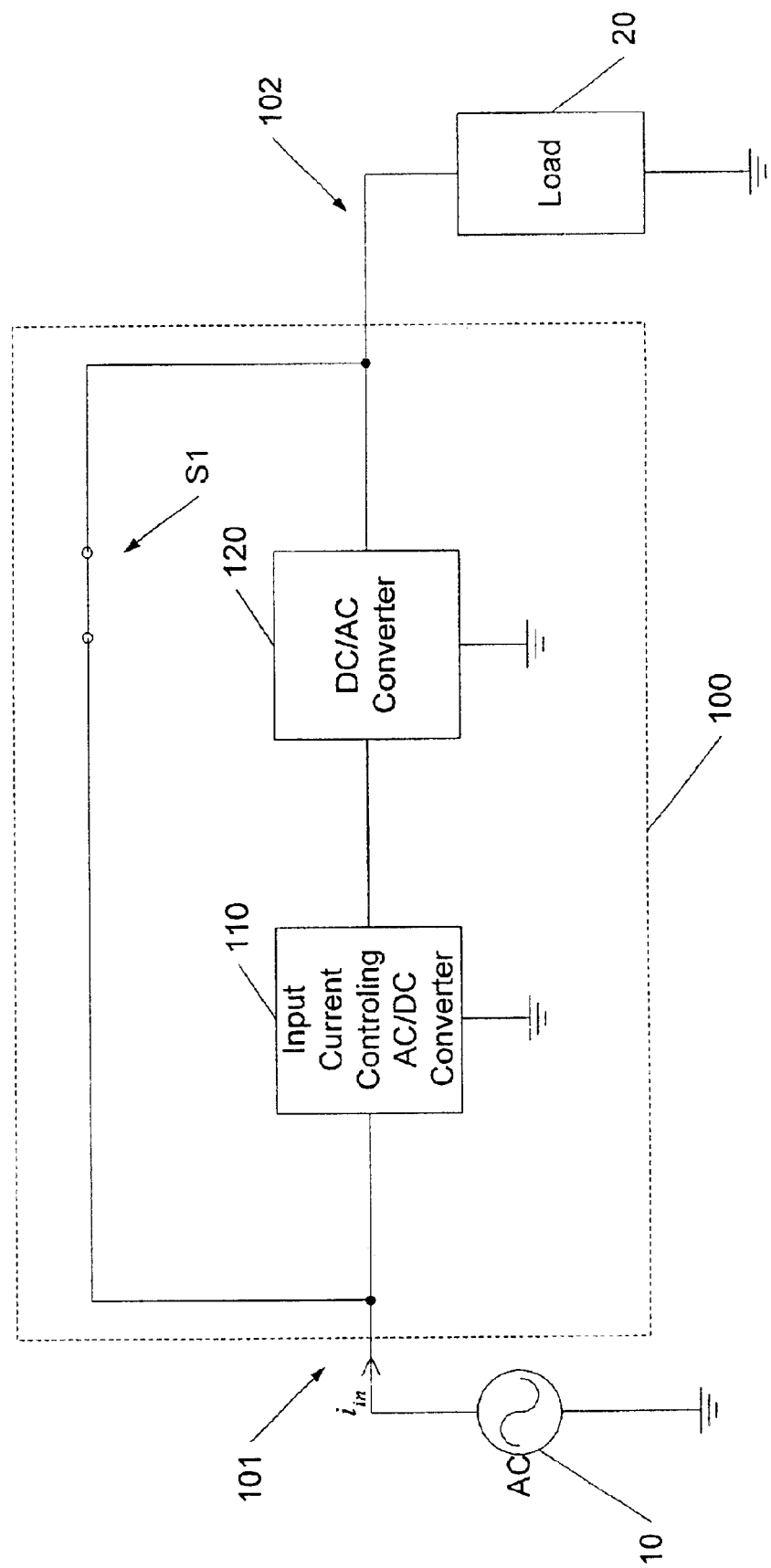
FIG. 1 is a schematic diagram illustrating a power conversion apparatus according to some embodiments of the invention.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements. It will be understood that when an element is referred to as being "connected" or "coupled" to another element, it can be directly connected or coupled to the other element or intervening elements may be present.

FIG. 1 illustrates a power supply apparatus 100 according to some embodiments of the invention The power supply apparatus 100 includes an input 101 configured to be coupled to an AC power source 10, and an output 102 configured to be coupled to a load 20. In a first mode of operation of the apparatus 100, a bypass circuit, here shown as including a switch S1, provides a direct coupling between the input 101 and the output 102 with switch S1 closed. In a second mode, switch S1 open (not shown), the switch S1 interrupts this coupling, such that the load 20 may be powered by a series combination of an AC/DC converter circuit 110, which is operative to produce a DC voltage from the AC power source 10, and an DC/AC converter circuit 120, which produces an AC voltage at the output 102 from the DC voltage. As illustrated, the AC/DC converter circuit 110 is operative to control a current $i_{in}$, at the AC input 101 when the apparatus is in the first (or "bypassed") mode, i.e., when the switch S1 is closed and the input 101 is coupled to the output 102. For example, the AC/DC converter circuit 110 may control current at the AC input 101 so as to act as a line conditioner that corrects a power factor at the AC input 101 in the first mode, which, in uninterruptible power supply (UPS) applications, may be an "economy" or "high efficiency" mode.

It will be understood that the AC/DC converter circuit 110, the DC/AC converter circuit and other components of FIG. 1 may take a variety of different forms. For example, the topology of FIG. 1 is applicable to both single phase and multiphase embodiments. The AC/DC converter circuit 110 may comprise any of a variety of different types of circuits, including, but not limited to, buck rectifier circuits and boost rectifier circuits, and combinations of a rectifier circuit and a regulating circuit operative to control currents in the rectifier circuit. The DC/AC converter circuit 120 may also comprise any of a variety of different types of circuits, including, but not limited to, half-bridge and full-bridge inverters. The bypass circuit may be implemented using any of a variety of mechanical and/or solid-state devices, including, but not limited to mechanical relays, silicon controlled rectifiers (SCRs), and combinations thereof.

Figure 2:
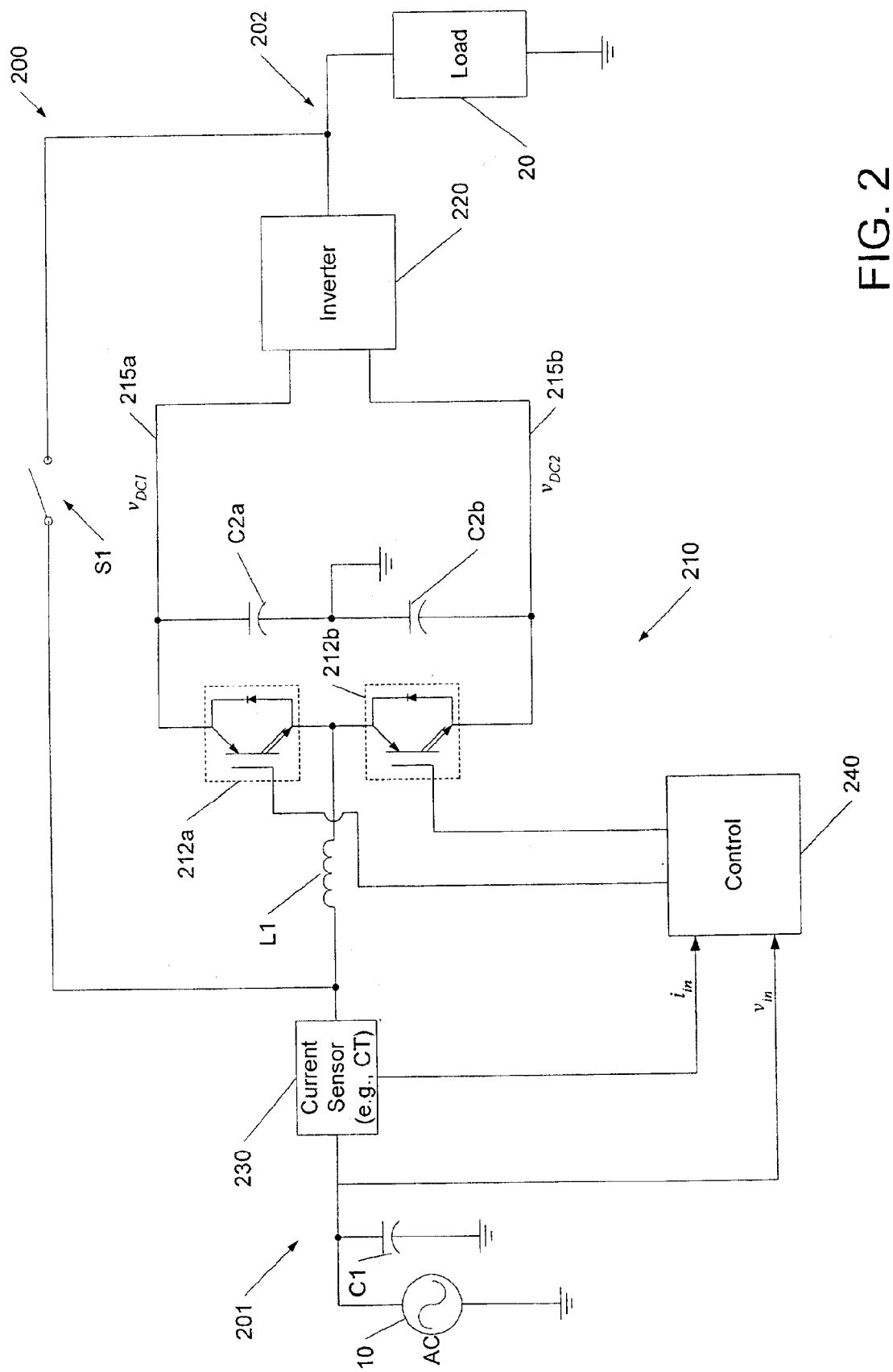
FIG. 2 is a schematic diagram illustrating a power conversion apparatus according to further embodiments of the invention.

An exemplary implementation according to some embodiments of the invention is illustrated in FIG. 2. Here, a power supply apparatus 200 includes an input 201 configured to be coupled to an AC power supply 10 and an output 202 configured to be coupled to a load 20. The apparatus 200 includes an input capacitor C1 and a series combination of a boost rectifier circuit 210 and an inverter circuit 220, coupled by DC busses 215a, 215b. The rectifier circuit 210 includes an inductor L1, insulated gate bipolar transistors (IGBTs) 212a, 212b in a half-bridge configuration, and storage capacitors C2a, C2b. The rectifier circuit 210 produces positive and negative DC voltages $v_{DC1}$, $v_{DC2}$ on the busses 215a, 215b. The transistors 212a, 212b are controlled by a control circuit 240, e.g., a digital and/or analog control circuit, responsive to the input voltage $v_{in}$ at the input 201 and to a sensed input current $i_{in}$, here shown as sensed by a current sensor 230, such as a current transformer (CT) or a Hall effect sensor.

The apparatus 200 further includes a bypass circuit, here shown as including a switch S1 that is operative to provide a bypass coupling between the input 201 and the output 202. As discussed in further detail below, in some embodiments, the control circuit 240 may control the transistors 212a, 212b responsive to the sensed current $i_{in}$ to provide a desired power factor at the input 201 when the rectifier circuit 210 and the inverter circuit 220 is bypassed (i.e., when the switch S1 is closed). The control circuit 240 may also be operative to provide power factor control when the switch S1 is open, i.e., when the apparatus is operating in an on-line mode. The inverter circuit 220 may be operative to decouple the DC busses 215a, 215b from the output 202 when the apparatus 200 is operating in the bypassed mode, or similar coupling and decoupling may be provided by a switch (not shown) placed between the inverter circuit 220 and the output 201. It will be further appreciated that the apparatus 200 may also operate in a mode in which the load 20 is concurrently powered via the inverter circuit 220 and the bypass circuit, for example, a mode in which an auxiliary DC power source, such as a battery, fuel cell or generator, coupled to the DC busses 215a, 215b, provides power to the load 20 to supplement power delivered by via the bypass path.

It will be understood that the circuitry shown in FIG. 2 may be modified within the scope of the invention. For example, circuits other that half-bridges and devices other than IGBTs may be used in the rectifier circuit 210. Instead of a single current sensor 230 placed between the input 201 and the junction of the rectifier circuit 210 and the bypass circuit, outputs of two current sensors, one in each of the bypass and on-line paths, may be summed to determine the current at the input 201. It will also be appreciated that the circuitry other than that shown in FIG. 2 may be used within the scope of the invention. For example, although a boost rectifier circuit is shown in FIG. 2, other types of AC/DC converter circuits may be used with the invention. For example, a buck rectifier circuit could be used to control input current in a fashion similar to the boost rectifier circuit described above. Moreover, although FIG. 2 illustrates a single-phase application, the invention also encompasses multiphase embodiments.

Figure 3:
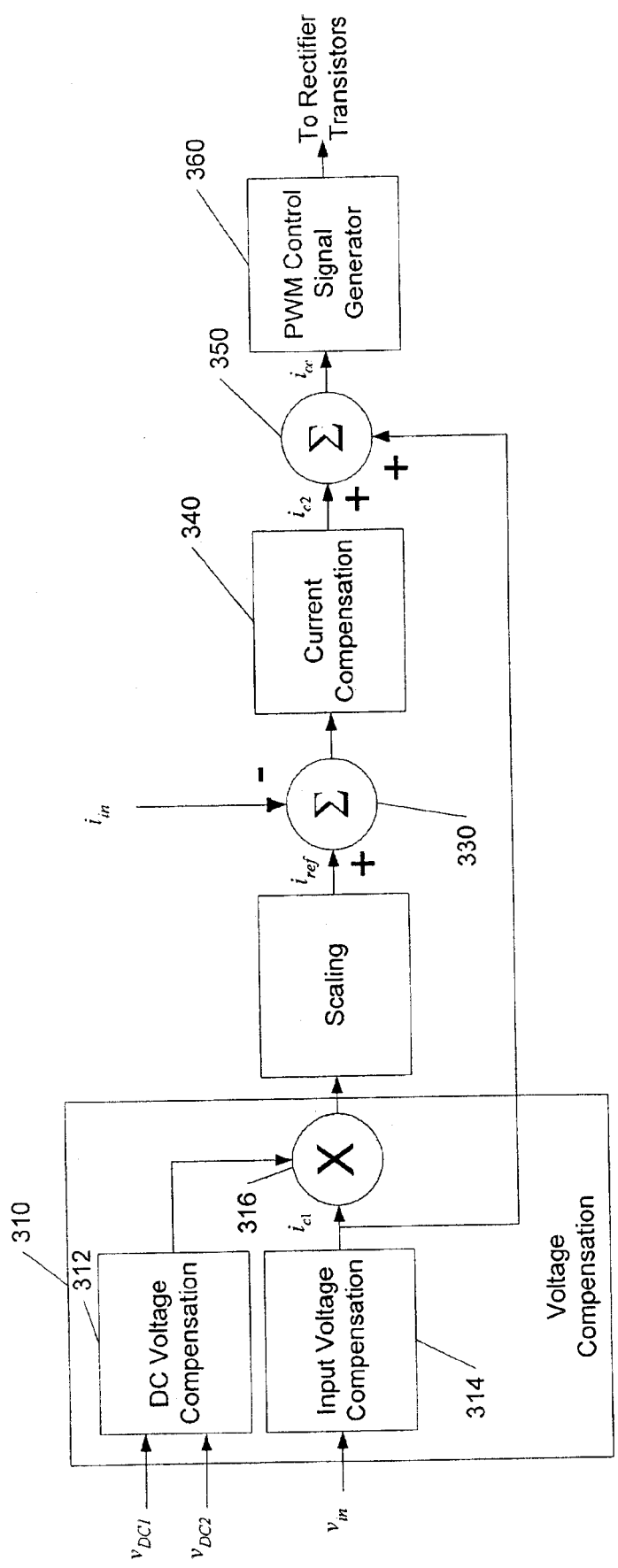
FIGS. 3 and 4 are schematic diagrams illustrating exemplary control architectures for a power conversion apparatus according to further some embodiments of the invention.

FIG. 3 illustrates an exemplary control architecture that may be used in the control circuit 240 of FIG. 2 according to some embodiments of the invention. A voltage compensation circuit 310 includes a DC voltage compensation circuit 312 and an input voltage compensation circuit 314. The input voltage compensation circuit 314 receive an input voltage signal $v_{in}$, for example, a analog voltage or digital value, that is representative of the voltage at the input 201. The input voltage compensation circuit 314 generates a first current command signal $i_{c1}$. The DC voltage compensation circuit 312 receives DC voltage signals $v_{DC1}$, $v_{DC2}$, which are representative of the DC voltages at the DC voltage busses 215a, 215b, and produces a signal that is multiplied by the first current command signal $i_{c1}$ in a multiplier 316. The first current command signal $i_{c1}$ is fed forward to a summing circuit 350, where it is added to a second current command signal $i_{c2}$.

The second current command signal $i_{c2}$ is generated from the product of the first current command signal $i_{c1}$ and the output of the DC voltage compensation circuit 312. In particular, the product of the first current command signal $i_{c1}$ and the output of the DC voltage compensation circuit 312 is scaled in a scaling circuit 320, producing a current reference signal $i_{ref}$ that is compared with an input current signal $i_{in}$ (which is representative of current at the input 201) in a summing circuit 330. The error signal produced by the summing circuit 330 is then fed to a current compensation circuit 340, which produces the second current command signal $i_{c2}$. The first and second current command signals $i_{c1}$, $i_{c2}$ are summed to produce a composite current command signal $i_{cc}$ that drives a pulse width modulator (PWM) control signal generator circuit 360 that controls the rectifier transistors 212a, 212b. The input current control provided by the control circuitry of FIG. 3 can provide power factor correction, by acting to keep the input current signal $i_{in}$ waveform substantially similar to that of the input voltage signal $v_{in}$ through use of a current reference signal derived from the input voltage signal $v_{in}$.

It will be appreciated that the control architecture illustrated in FIG. 3 can be implemented in an analog form, a digital form, or a combination thereof. For example, the control architecture may be implemented in a digital domain using a microprocessor, microcontroller, digital signal processor (DSP) or similar computing device, or may be implemented in analog form using active filters, analog multipliers, and the like. Those skilled in the art will appreciate that the control architecture illustrated in FIG. 3 is offered for exemplary purposes, and can be modified within the scope of the invention by using, for example, different loop topologies and different arrangements of gains and other control elements.

Figure 4:
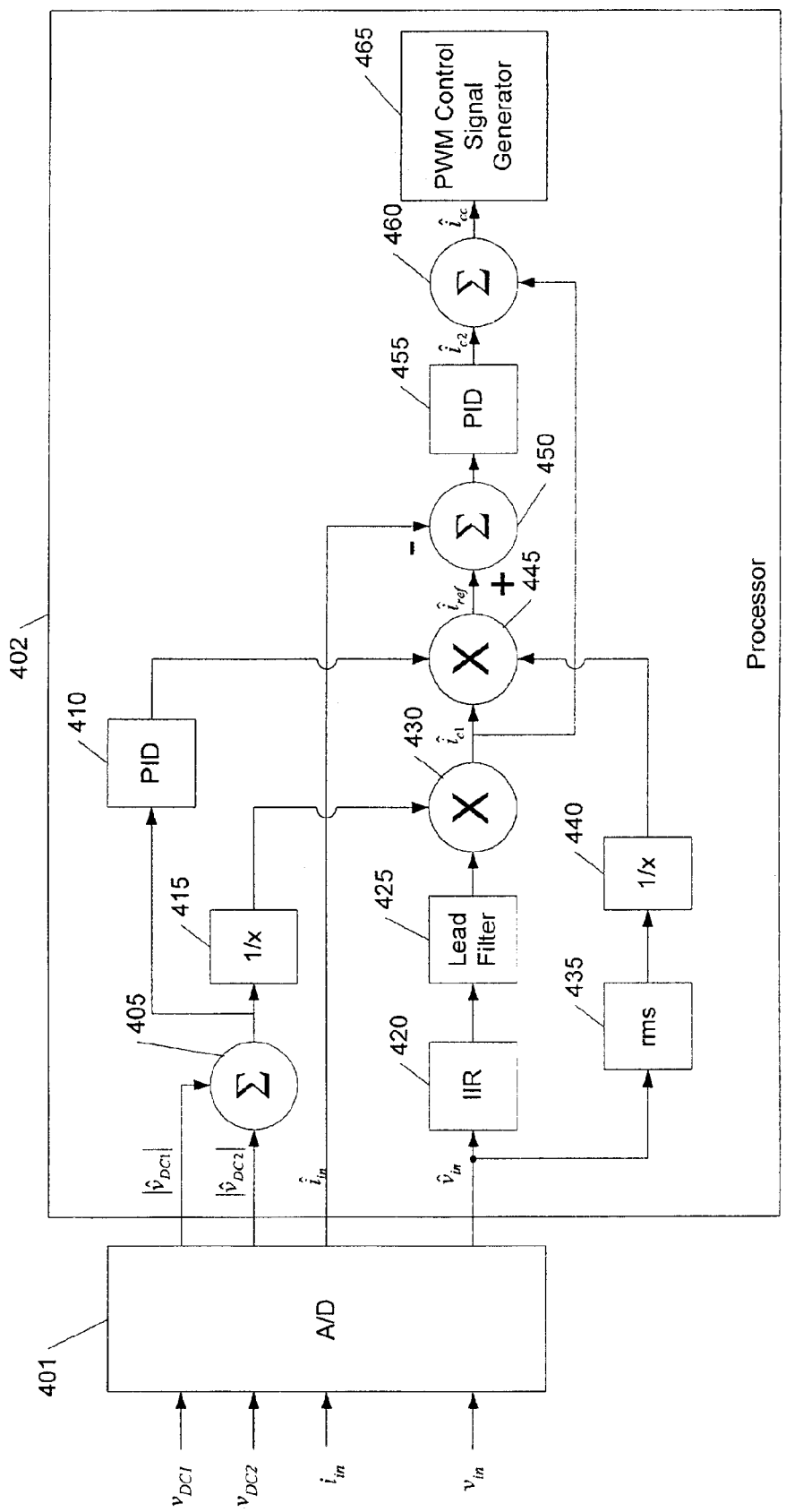

FIG. 4 illustrates a digital control architecture that may be used to implement a control scheme according to exemplary embodiments of the invention. An analog-to-digital (A/D) converter circuit 401 samples the input voltage and current signals $v_{in}$, $i_{in}$, and the DC voltages $v_{DC1}$, $v_{DC2}$ on the busses 212a, 212b, producing sampled signals $|\hat{v}_{DC1}|$, $|\hat{v}_{DC2}|$, $\hat{i}_{in}$, $\hat{v}_{in}$ that are passed to a processor 402, e.g., a microprocessor, microcontroller, DSP or other computing device, in which blocks 405–465 are implemented. It will be understood that the sampled signals $|\hat{v}_{DC1}|$, $|\hat{v}_{DC2}|$, $\hat{i}_{in}$, $\hat{v}_{in}$ may also be scaled, filtered and/or otherwise processed in the A/D converter circuit 401.

In the processor 402, the sampled input voltage signal $\hat{v}_{in}$ is filtered by an infinite impulse response (IIR) filter block 420 to remove higher frequency components, and then filtered by a lead filter block 425 to compensate for a phase lag imparted by the FIR filter block 420. The sampled DC voltage signals $|\hat{v}_{DC1}|$, $|\hat{v}_{DC2}|$ are summed in a summing block 405, producing a signal that is inverted in an inversion block 415 and used to multiply the output of the lead filter 425 in a multiplier block 430 and thereby produce a first current command signal $\hat{i}_{c1}$. The signal produced by the summing block 405 is also applied to a proportional integrator/differentiator (PID) compensation block 410.

The sampled input voltage signal $\hat{v}_{in}$ is also passed to a root mean square (rms) computation block 435, which produces a signal representative of an rms value of the input voltage signal $v_{in}$. This rms signal is then inverted in an inversion block 440, producing a signal that is multiplied by the first current command signal $\hat{i}_{c1}$ and by the output of the PID compensation block 410 in a multiplier block 445 to produce a current reference signal $\hat{i}_{ref}$. The sampled input current signal $\hat{i}_{c1}$ is then subtracted from the current reference signal $\hat{i}_{ref}$ in a summing block 450, producing an error signal that is applied to another PID compensation block 455, which produces a second current command signal $\hat{i}_{c2}$. The first and second current command signals $\hat{i}_{c1}$, $\hat{i}_{c2}$ are summed in a summing block 460 to produce a composite current command signal $\hat{i}_{cc}$ that is applied to a PWM control signal generator block 465.

The input current control provided by the control circuitry of FIG. 4 can provide power factor correction, by acting to keep the input current signal $i_{in}$ waveform substantially similar to that of the input voltage signal $v_{in}$ through use of a current reference signal derived from the input voltage signal $v_{in}$. Potential advantages of such a control architecture in a power supply apparatus, such as the apparatus 200 of FIG. 2, are numerous. Because the current control loop illustrated in FIG. 4 uses a current reference signal $\hat{i}_{ref}$ that is generated from a filtered version of the input voltage $v_{in}$, the current control loop can be less susceptible to high frequency perturbations of the input voltage $v_{in}$. The bandwidth of the current control loop can be quite high, as it can be mainly limited by the maximum switching frequency that can be supported by the PWM control signal generator block 460 and the transistors (or other switching devices) in the rectifier circuit 210. In addition, the rectifier control loops (i.e., the voltage and current loops) can be operated in a substantially seamless fashion over multiple modes. In particular, whether the apparatus is operating in an on-line or bypassed mode, the rectifier circuit 210 of the apparatus 200 can remain in operation, controlling input power factor by controlling the input current $i_{in}$, while the inverter circuit 220 is disabled or enabled, depending on the mode of operation. Such operation of the rectifier circuit 210 may be particularly advantageous for dealing with changeover from bypassed (or high-efficiency) mode to on-line operation, as the rectifier circuit 210 will already be up and stabilized, which can reduce the time needed to establish sufficient voltage on the DC busses 212a, 212b for on-line operation.

Figure 5:
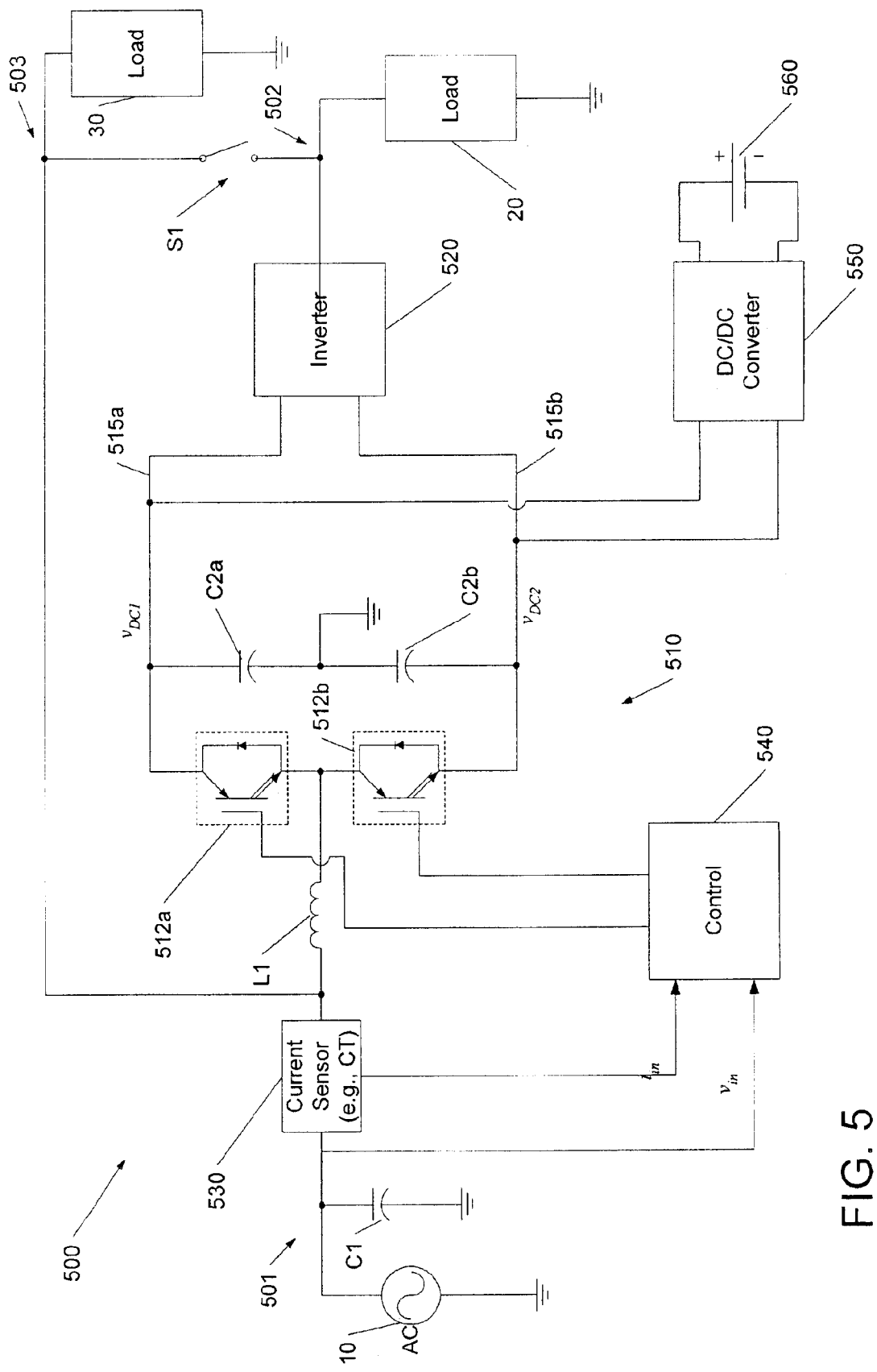
FIG. 5 is a schematic diagram illustrating a power conversion apparatus according to still further embodiments of the invention.

FIG. 5 illustrates an uninterruptible power supply (UPS) 500 according to further embodiments of the invention. The UPS 500 includes an input 501 configured to be coupled to an AC power supply 10 and an output 502 configured to be coupled to a load 20. The apparatus 500 includes an input capacitor C1 and a series combination of a rectifier circuit 510 and an inverter circuit 520, coupled by DC busses 515a, 515b. The rectifier circuit 510 includes an inductor L1, IGBTs 512a, 512b and storage capacitors C2a, C2b. The rectifier circuit 510 produces positive and negative DC voltages $v_{DC1}$, $v_{DC2}$ on the busses 515a, 515b. The transistors 512a, 512b are controlled by a control circuit 540 responsive to the input voltage $v_{in}$ at the input 501 and to an input current $i_{in}$ sensed by a current sensor 530.

A switch S1 is operative to provide a bypass coupling between the input 501 and the output 502. The control circuit 540 controls the transistors 512a, 512b responsive to the sensed current $i_{in}$, thereby controlling the current $i_{in}$ to provide, for example, a desired power factor at the input 501 when the rectifier circuit 510 and the inverter circuit 520 is in both online and bypassed modes. The UPS 500 also includes an auxiliary DC power source coupled to the DC busses 515a, 515b. As shown, the auxiliary DC power source includes a battery 560 and a DC/DC converter circuit 550, but it will be understood that other types of auxiliary DC power sources may be used.

The inverter circuit 520 may be operative to decouple the DC busses 515a, 515b from the output 502 when the apparatus 500 is operating in the bypassed mode, or such a coupling/decoupling function may be provided by a switch (not shown) placed between the inverter circuit 520 and the output 502. It will be further appreciated that the apparatus 500 may also operate in a mode in which the load 20 is powered via the inverter circuit 520 and the bypass circuit, for example, a mode in which the auxiliary DC power source (battery 560 and DC/DC converter circuit 550) provides power to the load 20 to supplement power delivered by via the bypass circuit.

According to further aspects of the invention, a second AC output 503 coupled to the input 501 may be provided. In particular, this output 503 may be used to provide line conditioning (e.g., power factor correction) for the second load 30 while the rectifier and inverter 510, 520 are operating in an on-line mode, providing more highly regulated power to the first load 20. Such a configuration may be advantageous in computer applications, for example. In particular, the first output 502 may be used to provide power to sensitive devices, such as desktop units, servers or disk arrays, while the second output 503 may be coupled to ancillary devices, such as monitors, that are less critical and/or more tolerant of voltage fluctuations, but that present non-linear loads that can degrade power factor. In this manner, the UPS 500 can operate as an online UPS for some loads while simultaneously acting as a line conditioner for other loads.

In the drawings and foregoing description thereof, there have been disclosed exemplary embodiments of the invention. Terms employed in the description are used in a generic and descriptive sense and not for purposes of limitation, the scope of the invention being set forth in the following claims.

That which is claimed:

1. A power supply apparatus, comprising:
    an AC input configured to be coupled to an AC power source;
    an AC output;
    an AC/DC converter circuit having an input coupled to the AC input;
    a DC/AC converter circuit coupled between an output of the AC/DC converter circuit and the AC output; and
    a bypass circuit operative to establish a coupling between the AC input and the AC output in a first state and to interrupt the coupling in a second state,
    wherein the AC/DC converter circuit is operative to control current at the AC input when the bypass circuit is in the first state.

2. An apparatus according to claim 1, wherein the AC/DC converter circuit is operative to correct a power factor at the AC input when the bypass circuit is in the first state.

3. An apparatus according to claim 1, wherein the DC/AC converter circuit is operative to produce an AC output voltage at the AC output when the bypass circuit is in the second state.

4. An apparatus according to claim 3, wherein the AC/DC converter circuit is operative to correct a power factor at the AC input when the bypass circuit is in the second state.

5. An apparatus according to claim 1, wherein the AC output comprises a first AC output and further comprising a second AC output coupled to the AC input when the bypass circuit is each of the first and second states.

6. An apparatus according to claim 3, further comprising means for coupling and decoupling the output of the DC/AC converter circuit to and from the AC output.

7. An apparatus according to claim 1, wherein the AC/DC converter circuit comprises:
    a switching circuit;
    a current reference signal generating circuit operative to generate a current reference signal responsive to a voltage at the AC input; and
    a current control circuit operative to control the switching circuit responsive to the current reference signal and to a current at the AC input.

8. An apparatus according to claim 7, further comprising a current sensor operative to sense the current at the AC input, and wherein the current control circuit is operative to control the switching circuit responsive to the sensed current.

9. An apparatus according to claim 1, further comprising a current sensor operative to sense a current at the AC input, and wherein the AC/DC converter circuit is operative to control a power factor at the AC input responsive to the sensed current at the AC input.

10. An apparatus according to claim 9, wherein the current sensor comprises:
    a first current sensor operative to sense a current passing through the bypass circuit; and
    a second current sensor operative to sense a current passing through the AC/AC converter circuit.

11. An apparatus according to claim 1, wherein the AC/DC converter circuit comprises a boost rectifier circuit.

12. An apparatus according to claim 1, wherein the DC/AC converter circuit comprises an inverter circuit.

13. An apparatus according to claim 1, wherein the DC/AC converter circuit is coupled to the output of the AC/DC converter circuit by a DC bus, wherein the AC/DC converter circuit is operative to produce a DC output voltage on the DC bus from the AC power source, and further comprising an auxiliary DC power source operative to power the DC bus.

14. A power supply apparatus, comprising:
    an AC input configured to be coupled to an AC power source;
    an AC output; and
    an AC/AC converter circuit including a rectifier circuit coupled to the AC input, wherein the rectifier circuit is operative to control a power factor at the AC input when the AC input is directly coupled to the AC output.

15. A power supply apparatus according to claim 14, further comprising a bypass circuit operative to establish a coupling between the AC input and the AC output in a first state, and to break the coupling between the AC input and the AC output in a second state.

16. An apparatus according to claim 15, wherein the AC/AC converter circuit is operative to produce an AC output voltage at the AC output when the bypass circuit is in the second state.

17. An apparatus according to claim 16, wherein the rectifier circuit is operative to control a power factor at the AC input when the bypass circuit is in the second state.

18. An apparatus according to claim 14, wherein the AC output comprises a first AC output that is selectively connectable to the AC input and further comprising a second AC output connectable to the AC input.

19. An apparatus according to claim 14, wherein the rectifier circuit comprises:
    a switching circuit;
    a current reference signal generating circuit operative to generate a current reference signal responsive to a voltage at the AC input; and
    a current control circuit operative to control the switching circuit responsive to the current reference signal and to a current at the AC input.

20. An apparatus according to claim 19, further comprising a current sensor operative to sense the current at the AC input, and wherein the current control circuit is operative to control the switching circuit responsive to the sensed current.

21. An apparatus according to claim 14, further comprising a current sensor operative to sense a current at the AC input, and wherein the rectifier is operative to control the power factor at the AC input responsive to the sensed current at the AC input.

22. An apparatus according to claim 14, wherein the rectifier circuit comprises a boost rectifier circuit and wherein the AC/AC converter circuit further comprises an inverter circuit coupled to an output of the rectifier circuit.

23. An apparatus according to claim 14, wherein the rectifier circuit is operative to produce a DC output voltage on a DC bus from the AC power source, and further comprising an auxiliary DC power source operative to power the DC bus.

24. A method of operating an AC power supply comprising an AC/AC converter circuit configured to be coupled between an AC input and an AC output and operative to generate an AC voltage at the AC output from an AC power source at the AC input, the AC/AC converter circuit including an AC/DC converter circuit coupled to the AC input, the method comprising:

directly coupling the AC input to the AC output while controlling a power factor at the AC input using the AC/DC converter circuit.

25. A method according to claim 24, wherein the AC/DC converter circuit comprises a rectifier circuit.

26. A method according to claim 1, comprising controlling the AC/DC converter circuit responsive to a current at the AC input while the AC input is directly coupled to the AC output.

* * * * *

UNITED STATES PATENT AND TRADEMARK OFFICE
CERTIFICATE OF CORRECTION

PATENT NO. : 6,906,933 B2
DATED : June 14, 2005
INVENTOR(S) : Pasi S. Taimela

It is certified that error appears in the above-identified patent and that said Letters Patent is hereby corrected as shown below:

Column 10,
Line 6, please change "claim 1" to -- claim 24 --.

Signed and Sealed this

Thirteenth Day of September, 2005

JON W. DUDAS
*Director of the United States Patent and Trademark Office*